United States Patent
Ma

(10) Patent No.: US 9,230,811 B2
(45) Date of Patent: Jan. 5, 2016

(54) ACTIVE LAYER ION IMPLANTATION METHOD AND ACTIVE LAYER ION IMPLANTATION METHOD FOR THIN-FILM TRANSISTOR

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 43 days.

(21) Appl. No.: 14/011,985

(22) Filed: Aug. 28, 2013

(65) Prior Publication Data
US 2014/0094002 A1    Apr. 3, 2014

(30) Foreign Application Priority Data
Sep. 28, 2012   (CN) .......................... 2012 1 0371558

(51) Int. Cl.
*H01L 21/265* (2006.01)
*H01L 21/24* (2006.01)
*H01L 29/66* (2006.01)

(52) U.S. Cl.
CPC ............. *H01L 21/265* (2013.01); *H01L 21/24* (2013.01); *H01L 21/2652* (2013.01); *H01L 29/66742* (2013.01); *H01L 29/66757* (2013.01)

(58) Field of Classification Search
CPC ............. H01L 21/265; H01L 21/2652; H01L 29/66757; H01L 29/78; H01L 21/24; H01L 21/266; H01L 29/66742; H01L 29/78618
USPC .................. 438/174, 217, 289, 291, 514, 531
See application file for complete search history.

(56) References Cited

U.S. PATENT DOCUMENTS

| | | | |
|---|---|---|---|
| 2002/0125535 | A1 | 9/2002 | Ueda |
| 2003/0143826 | A1 | 7/2003 | Yamashita et al. |
| 2004/0229416 | A1 | 11/2004 | Shih |
| 2005/0250050 | A1 | 11/2005 | Chen et al. |
| 2006/0008955 | A1 | 1/2006 | Sera et al. |
| 2009/0111251 | A1* | 4/2009 | Miyata .......................... 438/514 |
| 2009/0181501 | A1 | 7/2009 | Sekine et al. |
| 2011/0068341 | A1* | 3/2011 | Li et al. ........................... 257/59 |
| 2012/0196429 | A1 | 8/2012 | Tezuka et al. |

FOREIGN PATENT DOCUMENTS

| | | |
|---|---|---|
| CN | 1401142 A | 3/2003 |
| CN | 1722389 A | 1/2006 |
| CN | 1783439 A | 6/2006 |
| CN | 101060126 A | 10/2007 |
| CN | 102479680 A | 5/2012 |
| KR | 20060048671 A | 5/2006 |

OTHER PUBLICATIONS

European Search Report dated Jan. 15, 2014; Appln. No. 13182241.3-1552.

(Continued)

*Primary Examiner* — Thanhha Pham
(74) *Attorney, Agent, or Firm* — Ladas & Parry LLP

(57) ABSTRACT

Disclosed are an active layer ion implantation method and an active layer ion implantation method for thin-film transistor. The active layer ion implantation method comprises: applying a photoresist on the active layer; and implanting ions into the active layer through the photoresist.

3 Claims, 3 Drawing Sheets

(56) References Cited

OTHER PUBLICATIONS

First Chinese Office Action dated Jan. 24, 2014; Appln. No. 201210371558.1.
Second Chinese Office Action dated May 29, 2014; Appln. No. 201210371558.1.
First Korean Office Action Appln. No. 10-2013-0114131; Dated Oct. 10, 2014.
Korean Office Action Appln. No. 10-2013-0114131; Dated Mar. 31, 2015.

* cited by examiner

ACTIVE LAYER ION IMPLANTATION METHOD AND ACTIVE LAYER ION IMPLANTATION METHOD FOR THIN-FILM TRANSISTOR

FIELD OF THE ART

Embodiments of the invention relate to the field of liquid crystal displays (LCDs) fabrication, more particularly, an active layer ion implantation method and an active layer ion implantation method for thin-film transistor.

BACKGROUND

LCD panels made of Low Temperature Poly-silicon (LTPS) may reduce the power consumption of display panels. LTPS TFTs has been widely used because of the advantages of high resolution, fast response time, high brightness, high aperture ratio and the like.

When fabricating a LTPS TFT array substrate, active layer ion implantation is a crucial step for improving the TFT characteristics. FIG. 1 schematically illustrates a cross section of a currently widely-used LTPS TFT display panel. In a conventional process for fabricating LTPS TFT array substrate, a buffer layer P12 is first deposited on a glass substrate P11, then an amorphous silicon (a-Si) is deposited on the whole surface of the buffer layer P12, and the a-Si layer forms poly-silicon layer through a dehydrogenation process and a low temperature crystallization process. After crystallization, the active layer P13 is formed by the pattern process with a mask, which comprises exposing, developing, etching and peeling. And then the ion is implanted into the active layer P13.

In conventional technologies, when ion implantation is performed on the active layer P13, a gate insulating layer P14 deposited on the surface of the active layer P13 is used to protect the surface of the active layer P14 from damage by impact during the ion implantation. Implanted ions enter the active layer P13 through the gate insulating layer P14 and a final ion implantation effect as shown in FIG. 2 is achieved.

However, the characteristics of the gate insulating layer may be degraded because the doped ions may damage the film structure of the gate insulating layer during implanting process as well as some ions may be residual in the gate insulating layer. Furthermore, the ions in the gate insulating layer may be further diffused in later high temperature processes for the LTPS, which will further degrade the characteristics of the gate insulating layer.

SUMMARY

An objective of the invention is to provide an active layer ion implantation method and an active layer ion implantation method for thin-film transistor.

The objective of the invention is realized by the following technical solutions:

An aspect of the invention provides an active layer ion implantation method which comprises:

applying a photoresist on the active layer; and implanting ions into the active layer through the photoresist.

Another aspect of the invention provides an active layer ion implantation method for thin-film transistor which comprises:

applying a photoresist on the active layer; and.

implanting ions into a first region of the active layer that corresponds to a TFT channel region through the photoresist.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not (imitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In LTPS active layer ion implantation method in accordance with embodiments of the invention, an applied photoresist layer is used as a protection layer for the active layer during the ion implantation, which ensures that the active layer is not damaged when active layer ion implantation is performed and the film structure of the gate insulating layer is not damaged during consequential processes, thereby guaranteeing the characteristics of the TFT.

Figure 3A:
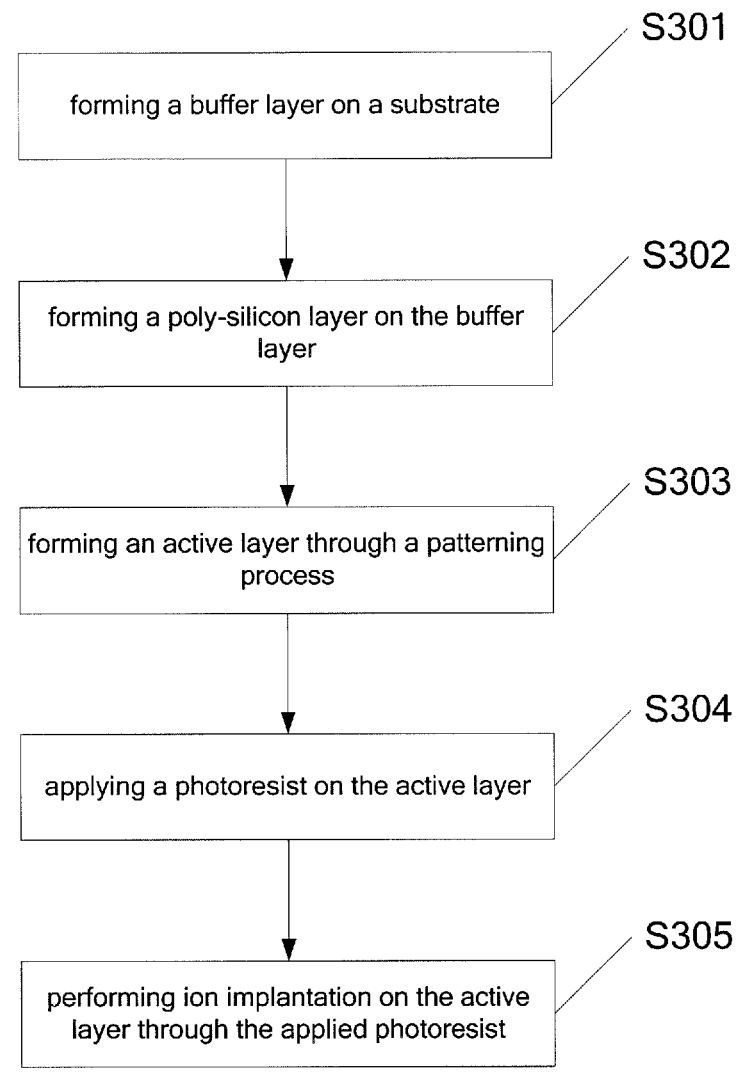
FIG. 3A is a flow chart of LTPS active layer ion implantation method provided by an embodiment of the invention.

A first embodiment of the invention provides an active layer ion implantation method. FIG. 3 illustrates a flow chart of LTPS active layer ion implantation method provided by the first embodiment of the invention, which comprises:

Step S301: forming a buffer layer 12 on a glass substrate 11.

For example, to prevent hazardous substances in the glass substrate from influencing the characteristics of the poly-silicon thin film layer, the buffer layer 12 is deposited on the glass substrate 11 using Chemical Vapor Deposition (such as PECVD), meanwhile the glass substrate 11 is pre-cleaned before depositing the buffer layer, such that cleanness of the glass substrate 11 can be improved.

Step S302: forming a poly-silicon layer on the buffer layer 12.

For example, a layer of amorphous silicon a-Si is deposited on the buffer layer 12 and then dehydrogenated and low-temperature crystallized to obtain a layer of poly-silicon.

Step S303: forming an active layer 13 through a patterning process.

For example, after obtaining the poly-silicon through crystallization, an active layer mask is used to expose, develop, etch and peel the poly-silicon layer to form the active layer 13.

Step S304: applying a photoresist 15 on the active layer 13.

For example, for the purpose of not damaging the active layer 13 and a gate insulating layer 14 during the ion implantation of the active layer 13, the embodiment of the invention applies a photoresist 15 on the active layer 13. The photoresist 15 is photosensitive. And photoresist 15 of a different thickness has a different transmissivity for the implanted ion (for example, ions can not pass the photoresist when the photoresist has a thickness of 2 μm or more). Therefore, a photoresist 15 having different thickness may be applied on the active layer as necessary such that partial regions of the active layer may be ion implanted.

Figure 3B:
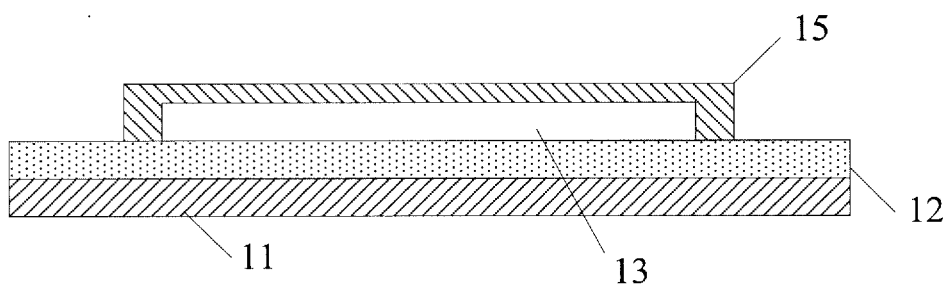
FIG. 3B schematically illustrates a configuration of an active layer with a photoresist applied thereon in accordance with an embodiment of the invention.

FIG. 3B schematically illustrates a configuration after the photoresist 15 is applied on the active layer 13.

Step S305: performing ion implantation on the active layer through the applied photoresist 15.

For example, a photoresist of different thickness has a different transmissivity for the ion implantation. Therefore, a photoresist 15 having different thickness may be applied on the active layer as necessary according to the region in which ion implanted through the photoresist 15 is required. It is also possible to apply a photoresist 15 of the same thickness and then partially expose the photoresist 15. After being partially exposed, the exposed portion of the photoresist 15 has a thickness that the ions can pass through, and the remaining unexposed portion has a thickness that the ions cannot pass through, thereby protecting the underlying active layer from damage by the ion impact.

Preferably, peeling of the photoresist 15 may be performed after ion implantation is finished, such that even if the photoresist 15 is damaged during ion implantation and the characteristics of the active layer is affected, it will no longer affect the characteristics of the active layer after peeling. If the applied photoresist material is not only photosensitive but also having not harmful effect on the characteristics of the semiconductor devices, peeling is not necessary.

The active layer ion implantation method provided by the first embodiment of the invention can protect the active layer from damage during ion implantation process and avoid using the gate insulating layer in the array substrate for implantation, by means of performing ion implantation via applying photoresist on the active layer, thereby improving the characteristics of the array substrate.

A second embodiment of the invention provides an active layer ion implantation method for TFT active layer by using the active layer ion implantation method in the first embodiment.

For example, during the fabrication of a LTPS TFT array substrate, in order to improve the TFT characteristics, it is only necessary to implant ions into a region of the active layer that corresponds to a TFT channel region. Therefore, in the embodiment of the invention, ion implantation is performed on the first region of the active layer that corresponds to the TFT channel region. In the following, a method for implanting ions into the first region of the active layer that corresponds to the TFT channel region will be described in detail.

The TFT active layer ion implantation method provided by the embodiment of the invention is applied to the fabrication process of LTPS TFT array substrate, in which conventional fabrication processes may be used prior to forming the active layer pattern, that is, a buffer layer is deposited on a glass substrate, then a layer of amorphous silicon is deposited on the buffer layer and then dehydrogenated and low-temperature crystallized to obtain a layer of poly-silicon. After crystallization is finished, an active layer mask is used to expose, develop, etch and peel the poly-silicon layer to form the pattern of the active layer. The embodiment of the invention will only describe in detail subsequent fabrication processes that are different from the conventional technologies.

In the embodiment of the invention, in order to implant ions into a first region of the active layer that corresponds to the TFT channel region while damaging neither the active layer nor the gate insulating layer, the method as employed by the first embodiment of the invention is used, that is a photoresist 15 is applied on the active layer. Since a photoresist 15 of different thickness has a different transmissivity for the ions, a photoresist of a thickness allowing the passing of ions may be applied to the first region while photoresist of other thicknesses may be applied to other regions, such that ions are only implanted into the first region corresponding to the channel region.

The process of applying the photoresist 15 with different thickness in the same layer is complicate and difficult to control. Therefore, preferably, in the embodiment of the invention, a photoresist 15 having a thickness that ions cannot pass through is first applied and then exposed and developed to partially expose the photoresist 15 and form a photoresist-completely-retained region and a photoresist-partially-retained region. The photoresist-completely-retained region with the thickness that ions cannot pass through corresponds to a region having the source and drain electrodes of the TFT. The photoresist-partially-retained region with the thickness that ions can pass thorough corresponds to the TFT channel region.

The embodiment of the invention exposes the photoresist in the following way such that the photoresist 15 is partially exposed:

Different exposes doses can cause different degrees of exposure of the photoresist 15. Preferably, photoresist 15 in the corresponding TFT channel region is partially exposed to form the photoresist-partially-retained region by adjusting the exposure dose.

Figure 4A:
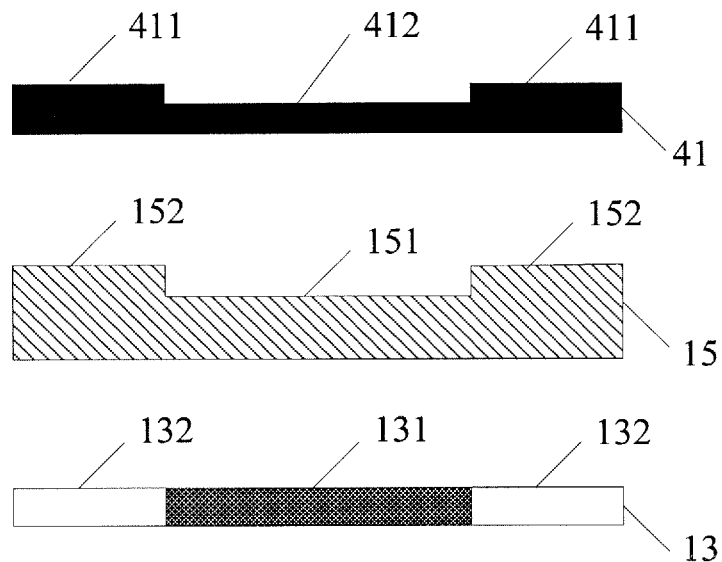
FIG. 4A schematically illustrates partially exposing the photoresist using a HTM mask in accordance with an embodiment of the invention.

Preferably, a half-tone mask (HTM) is used in the embodiment of the invention to expose the photoresist 15. A HTM mask selectively exposes and develops the photoresist by making the intensity of the transmitted light different in different regions. FIG. 4A illustrates a procedure of exposing the photoresist 15 using the HTM mask 41. The HTM mask 41 comprises an opaque region 411 and a semi-transparent region 412. The figure illustrates the photoresist after exposing, in which the photoresist-partially-retained region 151 corresponds to the semi-transparent region 412 of the HTM 41, and the photoresist-completely-retained region 152 corresponds to the opaque region 411 of the HTM 41. The photoresist-partially-retained region 151 corresponds to the first region 131 of the active layer 13 that corresponds to the TFT channel region, and the photoresist-completely-retained region 152 corresponds to a second region 132 of the active layer 13 that corresponds to the TFT drain/source electrode.

A gray tone mask (GTM) may also selectively exposes and develops the photoresist by making the intensity of the transmitted light different in different regions through the grating effect. Therefore, it is also preferable to use the GTM in the embodiment of the invention to expose the photoresist 15. The GTM also comprises an opaque region and a semi-transparent region, such that the semi-transparent region of the GTM corresponds to the photoresist-partially-retained region, and the opaque region corresponds to the photoresist-completely-retained region.

By means of the above-described method of partially exposing the photoresist 15 using the HTM or GTM in accordance with the embodiment of the invention, photoresist of different thickness can be formed through a single exposure and developing, thereby simplifying the fabrication process.

Figure 4B:
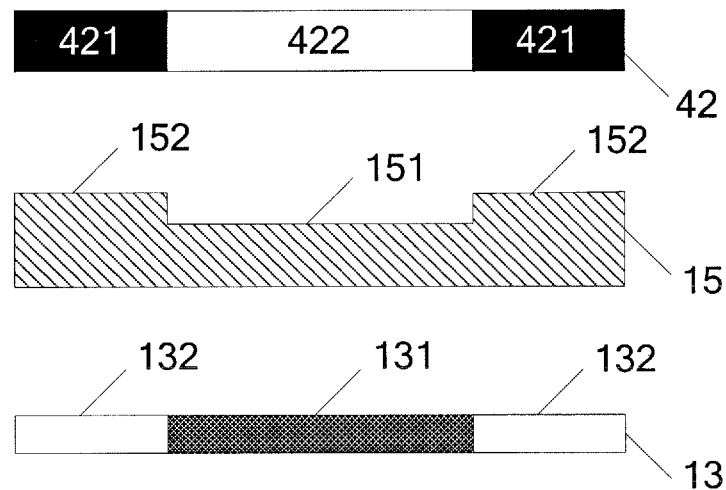
FIG. 4B schematically illustrates partially exposing the photoresist using a TFT source-drain electrode mask in accordance with an embodiment of the invention.

More preferably, as illustrated in FIG. 4B, when exposing the photoresist, the embodiment of the invention may use the TFT source/drain electrode mask 42 for forming the TFT source/drain electrode pattern to exposes the photoresist 15. The TFT source/drain electrode mask 42 comprises a pattern region 421 and an exposed region 422. Since the exposed region 422 of TFT source/drain electrode mask 42 corresponding to the channel region does not have any pattern, the region 422 corresponds to the photoresist-partially-retained region 151 (also corresponds to the first region 131 of the active layer). The portion of the photoresist 15 corresponding to the channel region may be partially exposed by controlling the exposure dose, and then the photoresist-partially-retained region 151 is formed. Similarly, since no ion implantation is needed for the second region 132 of the active layer that corresponds to the TFT source/drain electrode, the pattern region 421 of the TFT source/drain electrode mask 42 corresponds to the photoresist-completely-retained region 152.

In the embodiment of the invention, the photoresist is exposed by directly using the TFT source/drain electrode mask, such that the number of masks is not increased when fabricating the array substrate and fabrication process is simplified.

Figure 4C:
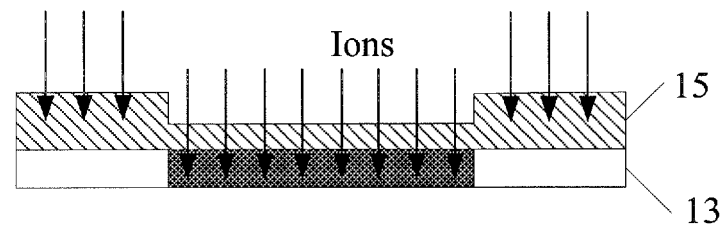
FIG. 4C schematically illustrates a configuration of an active layer which is ion implanted after partially exposing the photoresist during the fabrication of the LTPS TFT array substrate in accordance with an embodiment of the invention.

After partially exposing the photoresist as described above, as illustrated in FIG. 4C, ions can enter only the first region of the active layer that corresponds to the TFT channel region through the photoresist-partially-retained region when ion implantation is performed, while no ions can reach the second region of the active layer through the photoresist-completely-retained region, because the photoresist-completely-retained region has a thickness not allowing the ions to pass.

When implanting ions into the TFT active layer, it only needs to implant ions into the first region 151 of the active layer that corresponds to the TFT channel region while no ions needs to be implanted into the second region 152 of the active layer that corresponding to the source/drain electrode. However, during ion implantation, some ions are possibly implanted into the second region 152 of the active layer that corresponding to the source/drain electrode due to that the precision of the fabrication processes may not be high enough. Therefore, in the embodiment of the invention, the second region 152 of the active layer corresponding to the source/drain electrode region may be heavily reverse ion-doped to further increase the characteristics of the TFT.

Figure 1:
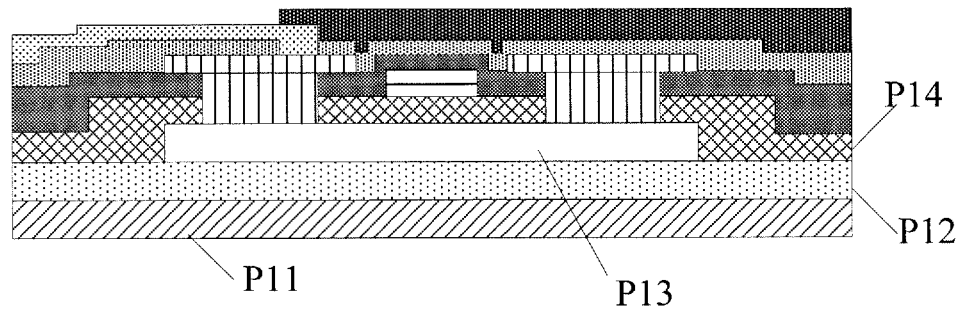
FIG. 1 schematically illustrates a cross section of a conventional LTPS TFT display panel.
Figure 2:
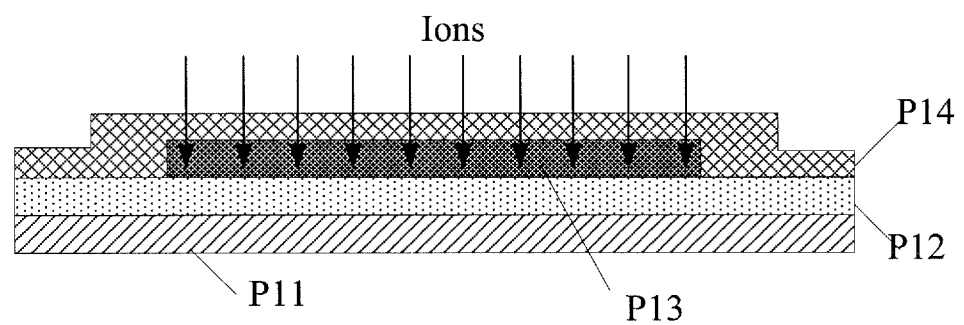
FIG. 2 schematically illustrates a configuration of an active layer which is ion implanted through a gate insulating layer in prior art.

After the above ion implantation is finished, the photoresist 15 may be peeled. In this case, even if the photoresist 15 is damaged and the characteristics of the active layer is affected, it is not affected any longer after pealing. In the subsequent processes for fabricating the array substrate, since ion implantation is already done, a gate metal layer may be directly deposited after depositing the gate insulating layer. The subsequent processes for fabricating the array substrate may be conventional LTPS processes, thereby eventually forming the LTPS TFT configuration as illustrated in FIG. 1.

According to the method for fabricating the LTPS TFT array substrate provided by the embodiments of the invention, when implanting ions into the first region of the active layer that corresponds to the TFT channel region, the applied photoresist is used as the protection layer for the active layer. Moreover, when ion implantation is done, the gate insulating layer is deposited after peeling the photoresist, thereby ensuring that the film structures of the active layer and the gate insulating layer are not damaged when implanting ions. Furthermore, the TFT source/drain electrode mask is used to partially expose the photoresist, as a result, the number of masks is not increased, thereby further reducing the fabrication process.

What are described above is related to the illustrative embodiments of the disclosure only and not limitative to the scope of the disclosure; the scopes of the disclosure are defined by the accompanying claims.

What is claimed is:

1. An active layer ion implantation method for TFT comprising:
    applying a photoresist on an active layer; and
    exposing the photoresist using a TFT source/drain electrode mask for forming the TFT source/drain electrode pattern to form a photoresist completely retained region and a photoresist partially retained region;
    wherein an exposed region of the TFT source/drain electrode mask corresponds to the photoresist-partially-retained region and a graphics region of the TFT source/drain electrode mask corresponds to the photoresist-completely-retained region; and
    implanting ions into a first region of the active layer that corresponds to a TFT channel region through the photoresist-partially retained region, wherein the photoresist-partially-retained region has a thickness designed to allow the ions to pass through the photoresist-partially-retained region and the photoresist completely retained region has a thickness designed to prevent the ions from passing through the photoresist completely retained region.

2. The method of claim 1, wherein in condition that ions are implanted into a second region of the active layer that corresponds to the TFT source/drain electrode region, the method further comprises:
    heavily reverse ion-doping the second region of the active layer that corresponds to the TFT source/drain electrode region.

3. The method of claim 1, wherein after ion implantation is finished, the method further comprises:
    peeling off the photoresist.

* * * * *